US 12,525,932 B2

(12) United States Patent
Yamaguchi

(10) Patent No.: US 12,525,932 B2
(45) Date of Patent: Jan. 13, 2026

(54) HIGH-FREQUENCY MODULE AND COMMUNICATION DEVICE

(71) Applicant: Murata Manufacturing Co., Ltd., Kyoto (JP)

(72) Inventor: Yukiya Yamaguchi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 467 days.

(21) Appl. No.: 18/331,534

(22) Filed: Jun. 8, 2023

(65) Prior Publication Data

US 2023/0318542 A1    Oct. 5, 2023

Related U.S. Application Data

(63) Continuation of application No. PCT/JP2021/046243, filed on Dec. 15, 2021.

(30) Foreign Application Priority Data

Jan. 14, 2021    (JP) .................. 2021-003966

(51) Int. Cl.
*H03F 3/195* (2006.01)

(52) U.S. Cl.
CPC ....... *H03F 3/195* (2013.01); *H03F 2200/294* (2013.01); *H03F 2203/21157* (2013.01)

(58) Field of Classification Search
CPC ...................................... H03F 3/195
USPC ........................................... 330/307
See application file for complete search history.

(56) References Cited

U.S. PATENT DOCUMENTS

| 2003/0169575 A1 | 9/2003 | Ikuta et al. |
| 2019/0273312 A1 | 9/2019 | Otsubo |
| 2020/0251459 A1 | 8/2020 | Tsuda et al. |
| 2021/0210438 A1 | 7/2021 | Nomura et al. |
| 2022/0102296 A1 | 3/2022 | Kitajima |

FOREIGN PATENT DOCUMENTS

| JP | 2002-359327 A | 12/2002 |
| JP | 2011-124366 A | 6/2011 |
| JP | 2020-126921 A | 8/2020 |
| WO | 2018/101384 A1 | 6/2018 |
| WO | 2020/067299 A1 | 4/2020 |
| WO | 2021/002296 A1 | 1/2021 |

OTHER PUBLICATIONS

International Search Report for PCT/JP2021/046243 dated Feb. 8, 2022.

*Primary Examiner* — Henry Choe
(74) *Attorney, Agent, or Firm* — McDonald Hopkins LLC

(57) ABSTRACT

A high-frequency module includes: a module substrate that has major surfaces that face each other; a plurality of post electrodes placed on the major surface; and a power amplification component placed on the major surface. The power amplification component includes: a base material that has major surfaces and that face each other, the major surface being located between the major surface and the major surface; an amplification transistor formed on a side of the major surface of the base material; and a metal electrode placed on the major surface and connected to the amplification transistor.

20 Claims, 7 Drawing Sheets

HIGH-FREQUENCY MODULE AND COMMUNICATION DEVICE

CROSS REFERENCE TO RELATED APPLICATION

This is a continuation of International Application No. PCT/JP2021/046243 filed on Dec. 15, 2021 which claims priority from Japanese Patent Application No. 2021-003966 filed on Jan. 14, 2021. The contents of these applications are incorporated herein by reference in their entireties.

BACKGROUND OF THE DISCLOSURE

Field of the Disclosure

The present disclosure relates to a high-frequency module and a communication device.

Description of the Related Art

Mobile communication devices such as cellular phones have become more complex in their high-frequency front-end modules along with the advancement of multiband technology, in particular. In Patent Document 1, the improvement of the heat dissipation of components placed on the surface (upper surface) of a module substrate is achieved with a metal block placed on the back surface (lower surface) of the module substrate.

Patent Document 1: Japanese Unexamined Patent Application Publication No. 2020-126921

BRIEF SUMMARY OF THE DISCLOSURE

However, with the related-art technology described above, it is difficult to improve the heat dissipation of components placed on the back surface of the module substrate, and it is difficult to place a power amplification component with a large amount of heat generation on the back surface of the module substrate.

Thus, the present disclosure provides a high-frequency module and a communication device that can improve the heat dissipation of a power amplification component placed on the back surface of a module substrate.

A high-frequency module according to an aspect of the present disclosure includes: a module substrate that has a first major surface and a second major surface that face each other; a plurality of external connection terminals placed on the second major surface; and a power amplification component placed on the second major surface. The power amplification component includes: a base material that has a third major surface and a fourth major surface that face each other, the third major surface being located between the second major surface and the fourth major surface; an amplification transistor formed on a side of the fourth major surface of the base material; and a first metal electrode placed on the fourth major surface and connected to the amplification transistor.

With the high-frequency module according to the aspect of the present disclosure, the heat dissipation of the power amplification component placed on the back surface of the module substrate can be improved.

DETAILED DESCRIPTION OF THE DISCLOSURE

Figure 1:
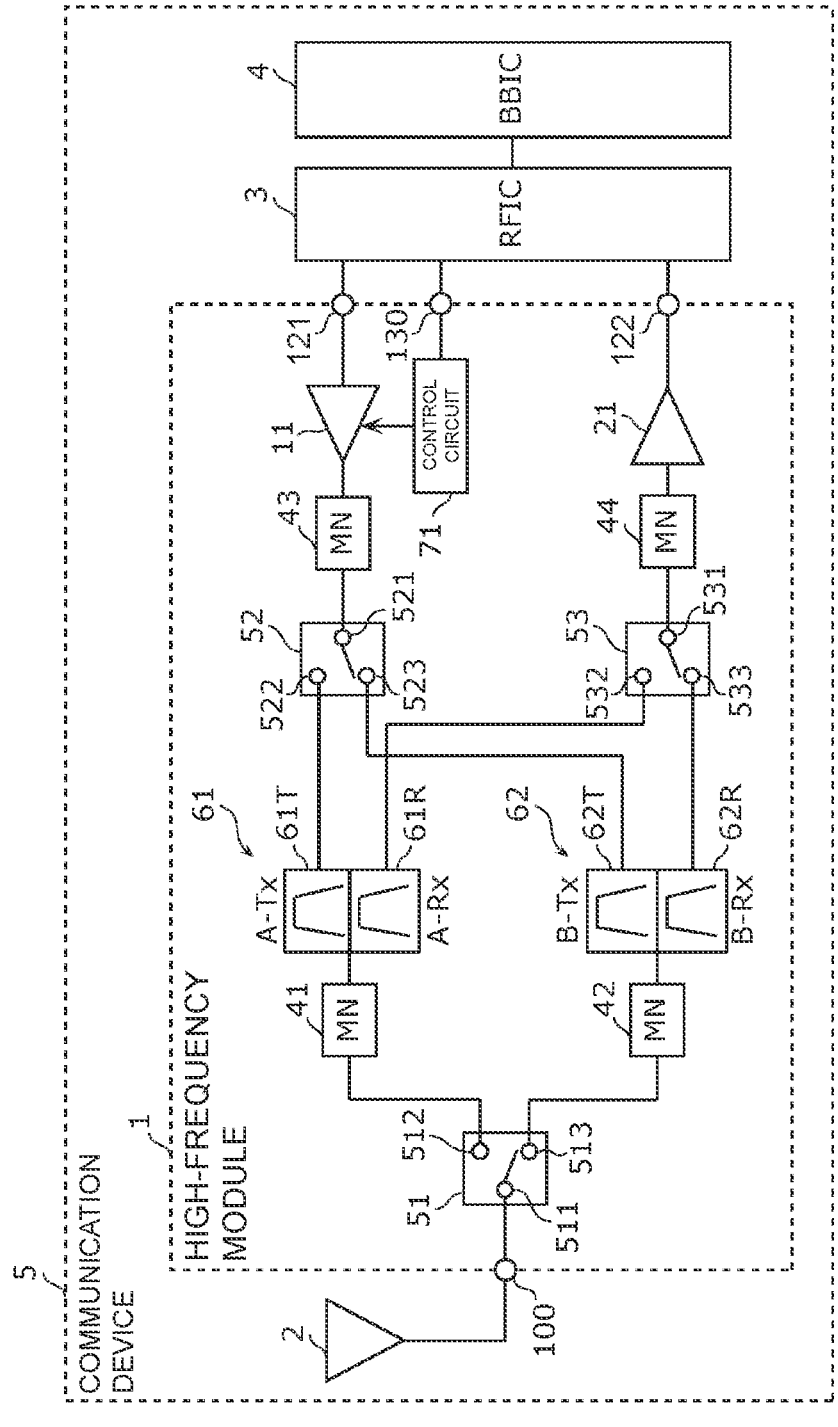
FIG. 1 is a circuit configuration diagram of a high-frequency module and a communication device according to Embodiment 1.

Now, embodiments of the present disclosure will be described in detail with reference to the drawings. Note that all the embodiments described below represent generic or specific examples. Numerical values, shapes, materials, components, component placement and connection modes, and the like described in the following embodiments are exemplary and are not intended to limit the present disclosure.

Note that each drawing is a schematic diagram in which emphasis, omission, or ratio adjustment has been applied as needed to illustrate the present disclosure and is thus not necessarily an exact illustration. Shapes, positional relationships, and ratios of each drawing are different from the actual ones in some cases. In each drawing, substantially the same configurations are denoted by the same reference characters, and the repetitive description thereof is omitted or simplified in some cases.

In each drawing described below, an x axis and a y axis are axes orthogonal to each other on a plane parallel to the major surfaces of a module substrate. Specifically, when a module substrate has a rectangular shape in plan view, the x axis is parallel to a first side of the module substrate, and the y axis is parallel to a second side orthogonal to the first side of the module substrate. Further, a z axis is an axis vertical to the major surfaces of a module substrate. The positive direction of the z axis indicates the upward direction, and the negative direction thereof indicates the downward direction.

In terms of the circuit configuration of the present disclosure, "being connected" includes not only the case of being directly connected by a connection terminal and/or a wiring conductor but also the case of being electrically connected with the interposition of another circuit element. "Being connected between A and B" means being connected, between A and B, to both A and B and includes, in addition to being connected in series to the path that connects A to B, being connected between the path in question and the ground.

In terms of the component placement of the present disclosure, "plan view" means viewing an object orthographically projected on the xy plane from the positive side of the z axis. "A overlaps B in plan view" means that the region of A orthographically projected on the xy plane overlaps the region of B orthographically projected on the xy plane. Further, terms indicating the relationship between elements, such as "parallel" and "vertical", terms indicating the shapes of elements such as "rectangle", and numerical value ranges do not only represent the strict meanings but also include substantially equivalent ranges with errors of about several percent, for example.

Further, "a component is placed on a substrate" includes, in addition to the case where the component is placed on the substrate while being in contact with the substrate, the case where the component is placed above the substrate without being in contact with the substrate (for example, the component is stacked on another component placed on the substrate) and the case where the component is embedded and placed in the substrate in part or totality. Further, "a component is placed on the major surface of a substrate" includes, in addition to the case where the component is placed on the major surface of the substrate while being in contact with the major surface, the case where the component is placed above the major surface without being in contact with the major surface and the case where the component is embedded and placed in the substrate in part from the major surface side. Further, "A is formed on a major surface B side of a base material" means that A is formed closer to the major surface B than to a major surface C on the opposite side of the major surface B.

Embodiment 1

[1.1 Circuit Configuration of High-Frequency Module 1 and Communication Device 5]

The circuit configurations of a high-frequency module 1 and a communication device 5 according to the present embodiment are described with reference to FIG. 1. FIG. 1 is a circuit configuration diagram of the high-frequency module 1 and the communication device 5 according to the present embodiment.

[1.1.1 Circuit Configuration of Communication Device 5]

First, the circuit configuration of the communication device 5 is described. As illustrated in FIG. 1, the communication device 5 according to the present embodiment includes the high-frequency module 1, an antenna 2, a radio frequency integrated circuit (RFIC) 3, and a baseband integrated circuit (BBIC) 4.

The high-frequency module 1 transfers a high-frequency signal between the antenna 2 and the RFIC 3. The internal configuration of the high-frequency module 1 is described later.

The antenna 2 is connected to an antenna connection terminal 100 of the high-frequency module 1. The antenna 2 receives a high-frequency signal from the outside and outputs the high-frequency signal to the high-frequency module 1.

The RFIC 3 is an example of a signal processing circuit configured to process a high-frequency signal. Specifically, the RFIC 3 performs signal processing, such as down-conversion, on a high-frequency reception signal inputted through the reception path of the high-frequency module 1, and outputs a reception signal generated by the signal processing in question to the BBIC 4. Further, the RFIC 3 includes a control unit configured to control switches, amplifiers, and the like included in the high-frequency module 1. Note that some or all of the functions as the control unit of the RFIC 3 may be implemented outside the RFIC 3, and may be implemented in the BBIC 4 or the high-frequency module 1, for example.

The BBIC 4 is a baseband signal processing circuit configured to perform signal processing by using an intermediate frequency band with a frequency lower than that of a high-frequency signal that is transferred by the high-frequency module 1. As a signal that is processed by the BBIC 4, for example, an image signal for image display and/or a sound signal for a phone call through a speaker is used.

Note that the antenna 2 and the BBIC 4 are optional components of the communication device 5 according to the present embodiment.

[1.1.2 Circuit Configuration of High-Frequency Module 1]

Next, the circuit configuration of the high-frequency module 1 is described. As illustrated in FIG. 1, the high-frequency module 1 includes a power amplifier 11, a low-noise amplifier 21, impedance matching circuits (MN) 41 to 44, switches 51 to 53, duplexers 61 and 62, a control circuit 71, the antenna connection terminal 100, a high-frequency input terminal 121, a high-frequency output terminal 122, and a control terminal 130.

The antenna connection terminal 100 is connected to the antenna 2 outside the high-frequency module 1.

The high-frequency input terminal 121 is a terminal for receiving a high-frequency transmission signal from the outside of the high-frequency module 1. In the present embodiment, the high-frequency input terminal 121 is connected to the RFIC 3 outside the high-frequency module 1.

The high-frequency output terminal 122 is a terminal for providing a high-frequency reception signal to the outside of the high-frequency module 1. In the present embodiment, the high-frequency output terminal 122 is connected to the RFIC 3 outside the high-frequency module 1.

The control terminal 130 is a terminal for transferring a control signal. That is, the control terminal 130 is a terminal for receiving a control signal from the outside of the high-frequency module 1 and/or a terminal for supplying a control signal to the outside of the high-frequency module 1. A control signal is a signal related to the control of electronic components included in the high-frequency module 1. Specifically, a control signal is, for example, a digital signal for controlling the power amplifier 11, the low-noise amplifier 21, and the switches 51 to 53, but is not limited to this.

The power amplifier 11 is connected between the high-frequency input terminal 121 and transmission filters 61T and 62T. Specifically, the input end of the power amplifier 11 is connected to the high-frequency input terminal 121. Meanwhile, the output end of the power amplifier 11 is connected to the transmission filters 61T and 62T with the impedance matching circuit 43 and the switch 52 interposed therebetween. The power amplifier 11 can amplify transmission signals in bands A and B received at the high-frequency input terminal 121. The transmission signals in the bands A and B amplified by the power amplifier 11 are each transferred to the transmission filters 61T and 62T through the impedance matching circuit 43 and the switch 52.

The low-noise amplifier 21 is connected between reception filters 61R and 62R and the high-frequency output terminal 122. Specifically, the input end of the low-noise amplifier 21 is connected to the reception filters 61R and 62R with the switch 53 and the impedance matching circuit 44 interposed therebetween. Meanwhile, the output end of the low-noise amplifier 21 is connected to the high-frequency output terminal 122. The low-noise amplifier 21 can amplify reception signals in the bands A and B received at the antenna connection terminal 100. The amplified reception signals in the bands A and B are outputted to the RFIC 3 through the high-frequency output terminal 122.

The impedance matching circuit 41 is connected to the output end of the transmission filter 61T and the input end of the reception filter 61R and is connected to the antenna connection terminal 100 with the switch 51 interposed therebetween. The impedance matching circuit 41 includes, for example, an inductor and/or a capacitor, and can achieve the impedance matching between the switch 51 and the duplexer 61.

The impedance matching circuit 42 is connected to the output end of the transmission filter 62T and the input end of the reception filter 62R and is connected to the antenna connection terminal 100 with the switch 51 interposed therebetween. The impedance matching circuit 42 includes, for example, an inductor and/or a capacitor, and can achieve the impedance matching between the switch 51 and the duplexer 62.

The impedance matching circuit 43 is connected to the output end of the power amplifier 11 and is connected to the input ends of the transmission filters 61T and 62T with the switch 52 interposed therebetween. The impedance matching circuit 43 includes, for example, an inductor and/or a capacitor, and can achieve the impedance matching between the output impedance of the power amplifier 11 and the input impedance of the switch 52.

The impedance matching circuit 44 is connected to the input end of the low-noise amplifier 21 and is connected to the output ends of the reception filters 61R and 62R with the switch 53 interposed therebetween. The impedance matching circuit 44 includes, for example, an inductor and/or a capacitor, and can achieve the impedance matching between the output impedance of the switch 53 and the input impedance of the low-noise amplifier 21.

The switch 51 is connected between the antenna connection terminal 100 and the duplexers 61 and 62. The switch 51 includes, for example, a multi-connection switch circuit, and is sometimes referred to as an antenna switch. Specifically, the switch 51 has terminals 511 to 513. The terminal 511 is connected to the antenna connection terminal 100. The terminal 512 is connected to the duplexer 61 with the impedance matching circuit 41 interposed therebetween. The terminal 513 is connected to the duplexer 62 with the impedance matching circuit 42 interposed therebetween.

In this connection configuration, the switch 51 can connect the terminal 511 to the terminal 512 and/or the terminal 513 on the basis of a control signal from the RFIC 3, for example. That is, the switch 51 can connect the antenna 2 to the duplexer 61 and/or the duplexer 62.

The switch 52 is connected between the power amplifier 11 and the transmission filters 61T and 62T. The switch 52 includes, for example, a multi-connection switch circuit, and is sometimes referred to as a transmission band select switch. Specifically, the switch 52 has terminals 521 to 523. The terminal 521 is connected to the output end of the power amplifier 11 with the impedance matching circuit 43 interposed therebetween. The terminal 522 is connected to the input end of the transmission filter 61T. The terminal 523 is connected to the input end of the transmission filter 62T.

In this connection configuration, the switch 52 can connect the terminal 521 to the terminal 522 and/or the terminal 523 on the basis of a control signal from the RFIC 3, for example. That is, the switch 52 can connect the power amplifier 11 to the transmission filter 61T and/or the transmission filter 62T.

The switch 53 is connected between the low-noise amplifier 21 and the reception filters 61R and 62R. The switch 53 includes, for example, a multi-connection switch circuit, and is sometimes referred to as a reception band select switch.

Specifically, the switch 53 has terminals 531 to 533. The terminal 531 is connected to the input end of the low-noise amplifier 21 with the impedance matching circuit 44 interposed therebetween. The terminal 532 is connected to the output end of the reception filter 61R. The terminal 533 is connected to the output end of the reception filter 62R.

In this connection configuration, the switch 53 can connect the terminal 531 to the terminal 532 and/or the terminal 533 on the basis of a control signal from the RFIC 3, for example. That is, the switch 53 can connect the low-noise amplifier 21 to the reception filter 61R and/or the reception filter 62R.

The duplexer 61 has a pass band that includes the band A. The duplexer 61 includes the transmission filter 61T and the reception filter 61R and enables frequency division duplex (FDD) in the band A.

The transmission filter 61T (A-Tx) is connected between the power amplifier 11 and the antenna connection terminal 100. Specifically, the input end of the transmission filter 61T is connected to the output end of the power amplifier 11 with the switch 52 and the impedance matching circuit 43 interposed therebetween. Meanwhile, the output end of the transmission filter 61T is connected to the antenna connection terminal 100 with the impedance matching circuit 41 and the switch 51 interposed therebetween. The transmission filter 61T has a pass band that includes the uplink operating band of the band A. The transmission filter 61T can pass, of transmission signals amplified by the power amplifier 11, transmission signals in the band A.

The duplexer 62 has a pass band that includes the band B. The duplexer 62 includes the transmission filter 62T and the reception filter 62R and enables the FDD in the band B.

The transmission filter 62T (B-Tx) is connected between the power amplifier 11 and the antenna connection terminal 100. Specifically, the input end of the transmission filter 62T is connected to the output end of the power amplifier 11 with the switch 52 and the impedance matching circuit 43 interposed therebetween. Meanwhile, the output end of the transmission filter 62T is connected to the antenna connection terminal 100 with the impedance matching circuit 42 and the switch 51 interposed therebetween. The transmission filter 62T has a pass band that includes the uplink operating band of the band B. The transmission filter 62T can pass, of transmission signals amplified by the power amplifier 11, transmission signals in the band B.

The reception filter 61R (A-Rx) is connected between the low-noise amplifier 21 and the antenna connection terminal 100. Specifically, the input end of the reception filter 61R is connected to the antenna connection terminal 100 with the impedance matching circuit 41 and the switch 51 interposed therebetween. Meanwhile, the output end of the reception filter 61R is connected to the input end of the low-noise amplifier 21 with the switch 53 and the impedance matching circuit 44 interposed therebetween. The reception filter 61R has a pass band that includes the downlink operating band of the band A. The reception filter 61R can pass, of reception signals received by the antenna 2, reception signals in the band A.

The reception filter 62R (B-Rx) is connected between the low-noise amplifier 21 and the antenna connection terminal 100. Specifically, the input end of the reception filter 62R is connected to the antenna connection terminal 100 with the impedance matching circuit 42 and the switch 51 interposed therebetween. Meanwhile, the output end of the reception filter 62R is connected to the input end of the low-noise amplifier 21 with the switch 53 and the impedance matching circuit 44 interposed therebetween. The reception filter 62R has a pass band that includes the downlink operating band of the band B. The reception filter 62R can pass, of reception signals received by the antenna 2, reception signals in the band B.

Note that each of the bands A and B is a frequency band for communication systems built by using radio access technology (RAT). The bands A and B are defined in advance by, for example, standardizing bodies (for example, the 3rd Generation Partnership Project (3GPP) and the Institute of Electrical and Electronics Engineers (IEEE)). Examples of the communication systems can include 5th generation new radio (5GNR) systems, long term evolution (LTE) systems, and wireless local area network (WLAN) systems.

The control circuit 71 can control the power amplifier 11. Specifically, the control circuit 71 receives a control signal from the RFIC 3 through the control terminal 130 and outputs the control signal to the power amplifier 11.

Note that some of the circuit elements illustrated in FIG. 1 are not necessarily included in the high-frequency module 1. For example, it is only necessary for the high-frequency module 1 to include at least the power amplifier 11, and the high-frequency module 1 does not necessarily include the other circuit elements.

[1.1.3 Circuit Configuration of Power Amplifier 11]

Figure 2:
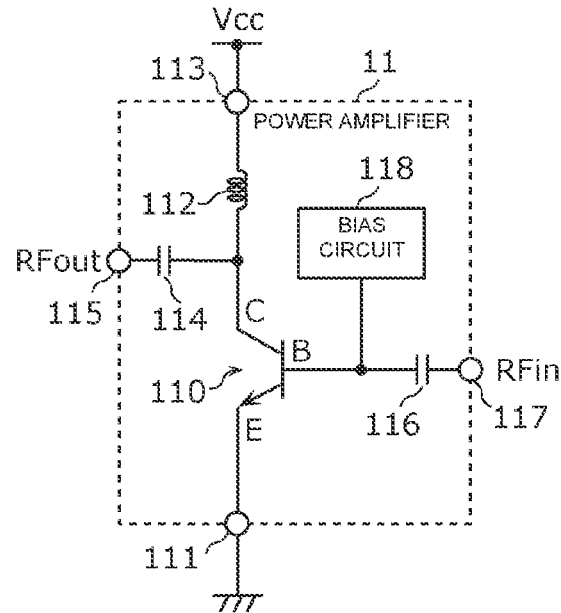
FIG. 2 is a circuit configuration diagram of a power amplifier included in the high-frequency module according to Embodiment 1.

Next, the circuit configuration of the power amplifier 11 is described with reference to FIG. 2. FIG. 2 is a circuit configuration diagram of the power amplifier 11 included in the high-frequency module 1 according to the present embodiment.

As illustrated in FIG. 2, the power amplifier 11 includes an amplification transistor 110, an inductor 112, a collector terminal 113, capacitors 114 and 116, an output terminal 115, an input terminal 117, and a bias circuit 118.

The amplification transistor 110 is a bipolar transistor having a collector, an emitter, and a base. The amplification transistor 110 can amplify a high-frequency current inputted to the base and output the resultant from the collector. Note that the amplification transistor 110 may be a field effect transistor having a drain, a source, and a gate.

An emitter terminal 111 is connected to the emitter of the amplification transistor 110. Further, the emitter terminal 111 is connected to the ground.

The inductor 112 is connected between the collector of the amplification transistor 110 and the collector terminal 113. The inductor 112 has the function of preventing a high-frequency signal from leaking from a high-frequency signal line for transferring a high-frequency signal into a power supply line for supplying a power supply voltage and preventing power supply noise from propagating from the power supply line to the high-frequency signal line. The inductor 112 is sometimes referred to as a choke inductor or a choke coil.

The collector terminal 113 is a terminal for receiving a power supply voltage Vcc from an external power supply (not illustrated) and is connected to the collector of the amplification transistor 110 with the inductor 112 interposed therebetween.

The capacitor 114 is connected between the output terminal 115 and the path that connects the collector of the amplification transistor 110 to the collector terminal 113. The capacitor 114 is a DC-cut capacitance element and has the function of removing the DC component of an amplified high-frequency signal having a DC bias voltage superimposed thereon.

The output terminal 115 is connected to the collector of the amplification transistor 110 with the capacitor 114 interposed therebetween. The output terminal 115 is a terminal for supplying an amplified high-frequency signal to the outside of the power amplifier 11 and is connected to the impedance matching circuit 43 outside the power amplifier 11 (FIG. 1).

The capacitor 116 is connected between the base of the amplification transistor 110 and the input terminal 117. The capacitor 116 is a DC-cut capacitance element and has the function of preventing a DC current from leaking into the input terminal 117 due to a DC bias voltage applied to the base from the bias circuit 118.

The input terminal 117 is connected to the base of the amplification transistor 110 with the capacitor 116 interposed therebetween. The input terminal 117 is a terminal for receiving a high-frequency signal from the outside of the power amplifier 11 and is connected to the high-frequency input terminal 121 outside the power amplifier 11 (FIG. 1).

The bias circuit 118 is connected to the base of the amplification transistor 110. The bias circuit 118 has the function of optimizing the operating point of the amplification transistor 110 by applying a bias voltage to the base of the amplification transistor 110.

With the above-mentioned circuit configuration of the power amplifier 11, a high-frequency signal RFin inputted from the input terminal 117 becomes a base current that flows from the base to the emitter of the amplification transistor 110. The base current is amplified by the amplification transistor 110 and becomes a collector current, and a high-frequency signal RFout that corresponds to the collector current in question is outputted from the output terminal 115. At this time, a large current obtained by adding the base current and the collector current together flows from the emitter terminal 111 to the ground. Thus, in order to improve the heat dissipation of the power amplifier 11, it is necessary to improve the heat dissipation from the emitter terminal 111, which needs to function as the heat dissipation portion of the amplification transistor 110.

Note that the circuit configuration of the power amplifier 11 of FIG. 2 is exemplary and is not limited to this. For example, the power amplifier 11 may be a multistage amplifier including a plurality of continuously connected amplification transistors. Further, the power amplifier 11 may be a differential amplifier or a Doherty amplifier.

[1.2 Component Placement of High-Frequency Module 1]

Next, an example of the component placement of the high-frequency module 1 configured as described above is specifically described with reference to FIG. 3 to FIG. 6.

Figure 3:
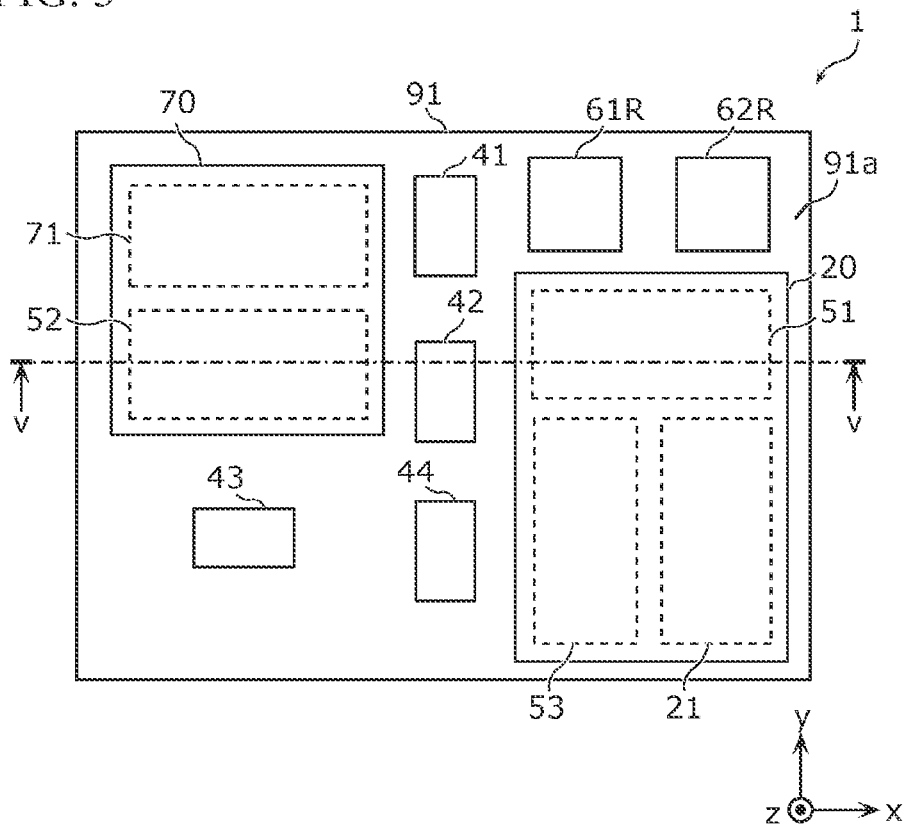
FIG. 3 is a plan view of the high-frequency module according to Embodiment 1.
Figure 4:
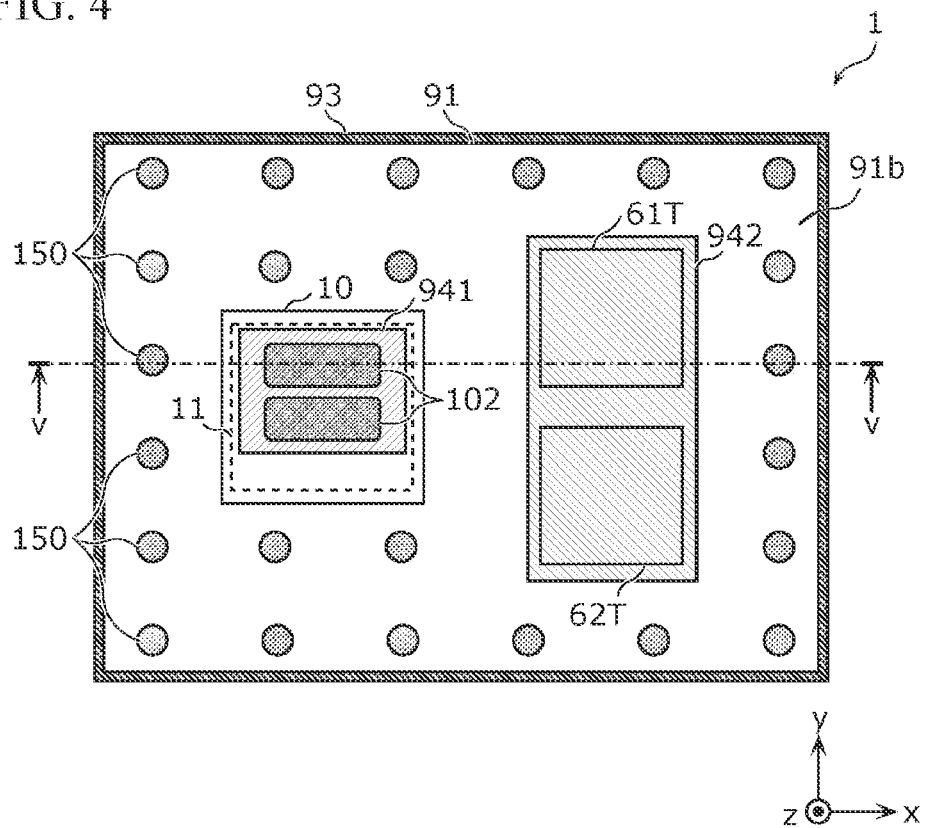
FIG. 4 is a perspective plan view of the high-frequency module according to Embodiment 1.
Figure 5:
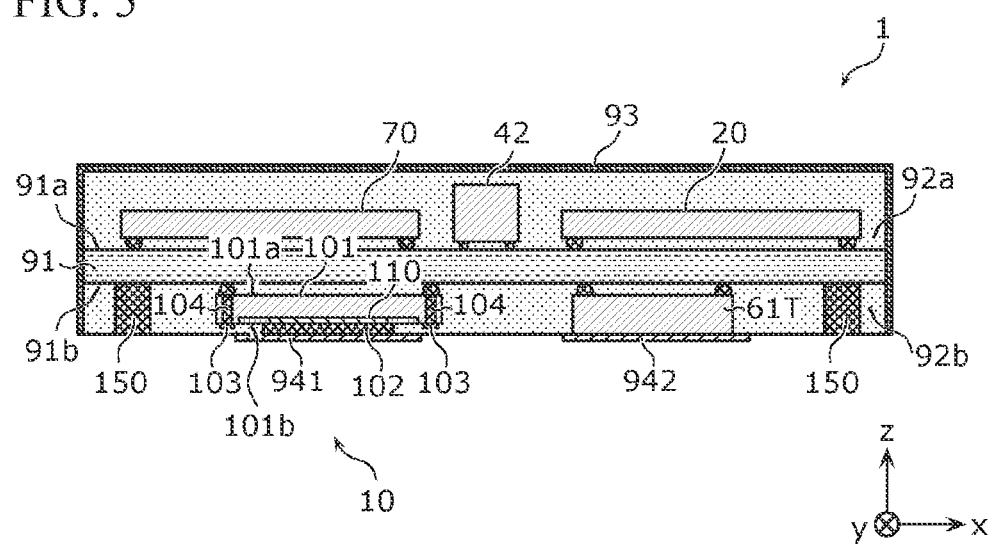
FIG. 5 is a sectional view of the high-frequency module according to Embodiment 1.
Figure 6:
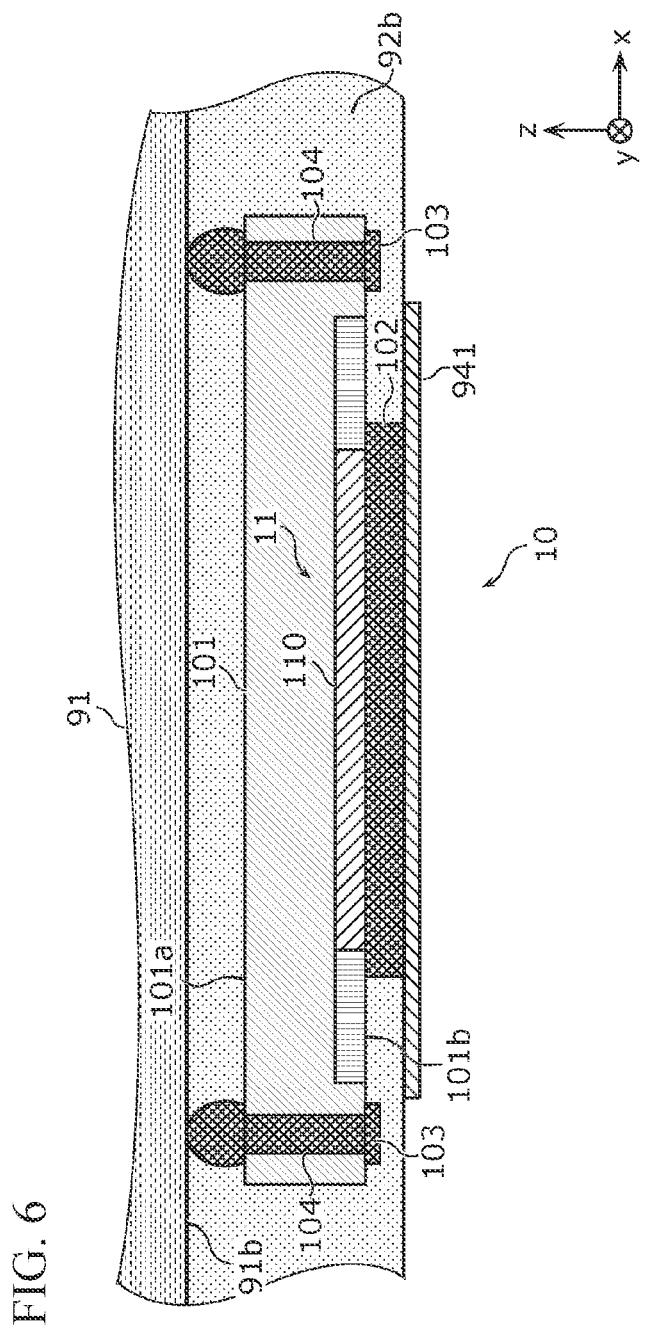
FIG. 6 is an enlarged sectional view of the vicinity of a power amplification component in the high-frequency module according to Embodiment 1.

FIG. 3 is a plan view of the high-frequency module 1 according to the present embodiment. Specifically, FIG. 3 is a view of a major surface 91a of a module substrate 91 when viewed from the positive side of the z axis. FIG. 4 is a perspective plan view of the high-frequency module 1 according to the present embodiment. Specifically, FIG. 4 is a perspective view of a major surface 91b side of the module substrate 91 when viewed from the positive side of the z axis. In FIG. 3 and FIG. 4, the internal configurations of the components are represented by the dashed lines. FIG. 5 is a sectional view of the high-frequency module 1 according to the present embodiment. FIG. 6 is an enlarged sectional view of the vicinity of a power amplification component 10 in the high-frequency module 1 according to the present embodiment. The cross sections of the high-frequency module 1 of FIG. 5 and FIG. 6 correspond to a cross section taken along the line v-v of FIG. 3 and FIG. 4. Note that, in FIG. 3 to FIG. 6, the illustrations of wires, each of which connects a plurality of components placed on the module substrate 91, are omitted, except for some wires.

The high-frequency module 1 further includes, in addition to the circuit components that include the circuit elements illustrated in FIG. 1, the module substrate 91, resin members 92a and 92b, shield electrode layers 93, 941, and 942, and a plurality of post electrodes 150. Note that, in FIG. 3 and FIG. 4, the illustrations of the resin members 92a and 92b are omitted. Further, in FIG. 3, the illustration of the shield electrode layer 93 is also omitted.

The module substrate 91 has the major surfaces 91a and 91b that face each other. The major surface 91a is an example of a first major surface, and the major surface 91b is an example of a second major surface. In the present embodiment, the module substrate 91 has a rectangular shape in plan view, but the shape of the module substrate 91 is not limited to a rectangular shape. As the module substrate 91, for example, a low temperature co-fired ceramics (LTCC) substrate or a high temperature co-fired ceramics (HTCC) substrate, which has a stacked structure of a plurality of dielectric layers, can be used. Further, as the module substrate 91, a substrate including built-in components, a substrate including a redistribution layer (RDL), a printed circuit board, or the like can also be used. Note that the module substrate 91 is not limited to those.

First, components to be placed on the major surface 91a are described. As illustrated in FIG. 3, on the major surface 91a, integrated circuits 20 and 70, the impedance matching circuits 41 to 44, and the reception filters 61R and 62R are placed. The major surface 91a and the components on the major surface 91a are covered by the resin member 92a as illustrated in FIG. 5.

The integrated circuit 20 is a semiconductor component having formed therein the low-noise amplifier 21 and the switches 51 and 53. The integrated circuit 70 is a semiconductor component having formed therein the control circuit 71 and the switch 52. The integrated circuit 20 and/or the integrated circuit 70 may include, for example, a complementary metal oxide semiconductor (CMOS), and may be manufactured by a silicon on insulator (SOI) process. With this, the integrated circuit 20 and/or the integrated circuit 70 can be manufactured inexpensively. Further, the integrated circuit 20 and/or the integrated circuit 70 may be made of at least one of gallium arsenide (GaAs), silicon germanium (SiGe), and gallium nitride (GaN). With this, the integrated circuit 20 and/or the integrated circuit 70 that is high quality can be achieved.

Each of the impedance matching circuits 41 to 44 includes, for example, a surface mount device (SMD). Note that the impedance matching circuits 41 to 44 are not limited to SMDs. For example, the impedance matching circuits 41 to 44 may include integrated passive devices (IPDs) or electrode patterns in the module substrate 91.

The reception filters 61R and 62R may each be any of a surface acoustic wave (SAW) filter, a bulk acoustic wave (BAW) filter, an LC resonance filter, and a dielectric filter, and are not limited to those.

The resin member 92a is an example of a second resin member and covers the major surface 91a and the components on the major surface 91a. The resin member 92a has the function of ensuring the reliability of the mechanical strength, moisture resistance, and the like of the components on the major surface 91a.

The shield electrode layer 93 is an example of a third shield electrode layer and is a metal thin film formed by a sputtering method, for example. The shield electrode layer 93 covers the upper surface and side surfaces of the resin member 92a, the side surfaces of the module substrate 91, and the side surfaces of the resin member 92b. The shield electrode layer 93 is set to the ground potential and can prevent the entry of external noise to the circuit components of the high-frequency module 1.

Next, components to be placed on the major surface 91b are described. On the major surface 91b, as illustrated in FIG. 4, the power amplification component 10, the transmission filters 61T and 62T, and the plurality of post electrodes 150 are placed. The major surface 91b and the components on the major surface 91b are covered by the resin member 92b as illustrated in FIG. 5.

The transmission filters 61T and 62T may each be any of a SAW filter, a BAW filter, an LC resonance filter, and a dielectric filter, and are not limited to those.

The power amplification component 10 is a semiconductor component having formed therein the power amplifier 11. The power amplification component 10 includes, as illustrated in FIG. 6, a base material 101, the power amplifier 11 including the amplification transistor 110, metal electrodes 102 and 103, and via conductors 104.

The base material 101 is made of a semiconductor material. As the semiconductor material, silicon (Si), gallium arsenide (GaAs), silicon germanium (SiGe), gallium nitride (GaN), or the like can be used, but the semiconductor material is not limited to those.

The base material 101 has major surfaces 101a and 101b that face each other. The major surface 101a is an example of a third major surface and faces the major surface 91b of the module substrate 91. The major surface 101b is an example of a fourth major surface and located on the opposite side of the major surface 101a. The major surface 101b faces a motherboard (not illustrated) placed in the negative direction of the z axis of the high-frequency module 1. At this time, the major surface 101a of the base material 101 is located between the major surface 91b of the module substrate 91 and the major surface 101b of the base material 101 in a cross-sectional view. In the base material 101, the plurality of via conductors 104 extending along the z axis are placed. On the major surface 101b side of the base material 101, the power amplifier 11 including the amplification transistor 110 is formed.

The metal electrode 102 is an example of a first metal electrode. The metal electrode 102 is placed on the major surface 101b and connected to the amplification transistor 110 formed on the major surface 101b. Specifically, the metal electrode 102 is electrically connected to the emitter of the amplification transistor 110 with the emitter terminal 111 of the power amplifier 11 interposed therebetween. At least a part of the metal electrode 102 overlaps at least a part of the amplification transistor 110 in plan view.

The metal electrode 102 is projected from the major surface 101b, and the end surface thereof reaches the surface of the resin member 92b to be in contact with the shield electrode layer 941. The metal electrode 102 is connected to the ground terminal or the like on the motherboard, which is placed in the negative direction of the z axis of the high-frequency module 1, with the shield electrode layer 941 interposed therebetween. That is, the metal electrode 102 is connected to the ground and functions as a ground electrode.

Note that, in FIG. 4, the number of the metal electrodes 102 is two, but is not limited to this. The number of the metal electrodes 102 may be one or three or more.

Each of the plurality of metal electrodes 103 is an example of a second metal electrode. Each of the plurality of metal electrodes 103 is placed on the major surface 101b and connected to the amplification transistor 110 formed on the major surface 101b. Specifically, the plurality of metal electrodes 103 are electrically connected to the respective base and collector of the amplification transistor 110 with the collector terminal 113, the output terminal 115, and the input terminal 117 of the power amplifier 11 interposed therebetween. Further, the plurality of metal electrodes 103 are connected to the plurality of respective via conductors 104 formed in the base material 101 and are connected to the major surface 91b of the module substrate 91 with the plurality of via conductors 104 interposed therebetween.

Each of the plurality of via conductors 104 is an example of a conductor for connecting the metal electrode 103 to the major surface 91b of the module substrate 91. That is, the plurality of via conductors 104 electrically connect the plurality of metal electrodes 103 on the major surface 101b of the base material 101 to a plurality of metal electrodes (not illustrated) on the major surface 91b of the module substrate 91.

In the present embodiment, each of the plurality of via conductors 104 is a metal conductor filled in a through via that penetrates the base material 101 in the z direction. Note that the via conductor 104 is not limited to a conductor filled in a through via. For example, the via conductor 104 may include two conductors filled in two blind vias formed in the respective major surfaces 101a and 101b. In this case, it is only necessary for the two conductors in question to be connected to each other by a planar electrode pattern formed in the base material 101.

The plurality of post electrodes 150 correspond to an example of a plurality of external connection terminals and include a ground terminal in addition to the antenna connection terminal 100, the high-frequency input terminal 121, the high-frequency output terminal 122, and the control terminal 130, which are illustrated in FIG. 1. Each of the plurality of post electrodes 150 vertically extends from the major surface 91b to penetrate the resin member 92b, and one end thereof reaches the surface of the resin member 92b. The plurality of post electrodes 150 are each connected to an input-output terminal, a ground terminal, and/or other terminals on the motherboard placed in the negative direction of the z axis of the high-frequency module 1.

The resin member 92b is an example of a first resin member and covers the major surface 91b and the components on the major surface 91b. The resin member 92b has the function of ensuring the reliability of the mechanical strength, moisture resistance, and the like of the components on the major surface 91b.

The shield electrode layer 941 is an example of a first shield electrode layer, and the shield electrode layer 942 is an example of a second shield electrode layer. The shield electrode layers 941 and 942 are represented as the hatched regions in FIG. 4. The shield electrode layers 941 and 942 are metal thin films formed by a sputtering method, for example, like the shield electrode layer 93.

At least a part of the shield electrode layer 941 overlaps at least a part of the metal electrode 102 in plan view. Specifically, the shield electrode layer 941 is formed to cover the metal electrode 102 and is in contact with the metal electrode 102. Further, in plan view, the area of the shield electrode layer 941 is larger than the area of the metal electrode 102.

At least a part of the shield electrode layer 942 overlaps at least a part of the transmission filters 61T and 62T in plan view. Specifically, the shield electrode layer 942 is formed to cover the transmission filters 61T and 62T and is in contact with the transmission filters 61T and 62T. To prevent the shield electrode layer 942 from peeling off the surfaces of the transmission filters 61T and 62T, the surfaces of the transmission filters 61T and 62T may be smoothed by chemical etching. The shield electrode layer 942 is formed on the thus smoothed surfaces of the transmission filters 61T and 62T so that the shield electrode layer 942 can be stably in contact with the surfaces of the transmission filters 61T and 62T.

The shield electrode layers 941 and 942 are not in contact with each other and are not in contact with the shield electrode layer 93 either. The shield electrode layers 941 and 942 are connected to the ground terminal or the like on the motherboard, which is placed in the negative direction of the z axis of the high-frequency module 1, and are thus set to the ground potential.

Note that the configuration of the high-frequency module 1 and the placement, shapes, and the like of the components of FIG. 3 to FIG. 6 are exemplary, and the present disclosure is not limited to this. For example, in FIG. 4, the power amplification component 10 has a rectangular shape in plan view, but the shape of the power amplification component 10 is not limited to this. Further, the high-frequency module 1 does not necessarily include the resin members 92a and 92b and the shield electrode layers 93, 941, and 942 and may include a plurality of bump electrodes instead of the plurality of post electrodes 150.

[1.3 Effects, Etc.]

As described above, the high-frequency module 1 according to the present embodiment includes: the module substrate 91 that has the major surfaces 91a and 91b that face each other; the plurality of post electrodes 150 placed on the major surface 91b; and the power amplification component 10 placed on the major surface 91b. The power amplification component 10 includes: the base material 101 that has the major surface 101a and the major surface 101b on the opposite side of the major surface 101a, the major surface 101a being located between the major surface 91b and the major surface 101b; the amplification transistor 110 formed on the side of the major surface 101b of the base material 101; and the metal electrode 102 placed on the major surface 101b and connected to the amplification transistor 110.

With this, the amplification transistor 110 is formed on the major surface 101b side of the base material 101, and the metal electrode 102 is placed on the major surface 101b. Thus, the heat of the amplification transistor 110 can be released to the outside of the high-frequency module 1 through the metal electrode 102. At this time, as compared to the case where the amplification transistor 110 is formed on the major surface 101a side of the base material 101, the heat dissipation path from the amplification transistor 110 to the outside through the metal electrode 102 can be shortened, and the heat dissipation of the power amplification component 10 placed on the major surface 91b of the module substrate 91 can therefore be improved.

Further, for example, in the high-frequency module 1 according to the present embodiment, at least a part of the metal electrode 102 may overlap at least a part of the amplification transistor 110 in plan view.

With this, since the metal electrode 102 overlaps the amplification transistor 110, the heat dissipation path can be further shortened, and the heat dissipation of the power amplification component 10 can therefore be improved.

Further, for example, the high-frequency module 1 according to the present embodiment may include the resin member 92b for covering at least a part of the major surface 91b. The metal electrode 102 may be projected from the major surface 101b to reach the surface of the resin member 92b.

With this, the metal electrode 102 can also be in contact with an electrode or the like outside the high-frequency module 1 so that the heat dissipation path can be further shortened, and the heat dissipation of the power amplification component 10 can therefore be improved.

Further, for example, the high-frequency module 1 according to the present embodiment may include the shield electrode layer 941 for covering at least a part of the surface of the resin member 92b. At least a part of the metal electrode 102 may overlap at least a part of the shield electrode layer 941 in plan view, and the area of the shield electrode layer 941 may be larger than the area of the metal electrode 102 in plan view.

With this, the metal electrode 102 can be connected to the shield electrode layer 941 at a relatively short distance. At this time, the heat from the metal electrode 102 can be diffused by the shield electrode layer 941 so that the cross-sectional area of the heat dissipation path can be increased. As a result, the heat dissipation of the power amplification component 10 can be improved.

Further, for example, in the high-frequency module 1 according to the present embodiment, the metal electrode 102 may be in contact with the shield electrode layer 941.

With this, with the metal electrode 102 in direct contact with the shield electrode layer 941, the heat dissipation path can be shortened.

Further, for example, in the high-frequency module 1 according to the present embodiment, the metal electrode 102 may be connected to the ground.

With this, in the common-emitter circuit, the emitter terminal 111 can be connected to the metal electrode 102 so that the heat of the amplification transistor 110 can be effectively released to the outside.

Further, for example, in the high-frequency module 1 according to the present embodiment, the power amplification component 10 may include the metal electrode 103 placed on the major surface 101b and connected to the amplification transistor 110. The high-frequency module 1 may include the via conductor 104 formed in the base material 101, for connecting the metal electrode 103 to the major surface 91b of the module substrate 91.

With this, the collector terminal 113, the output terminal 115, and the input terminal 117 of the amplification transistor 110, which is formed on the major surface 101b side of the base material 101, can be connected to the major surface 91b of the module substrate 91 with the metal electrodes 103 and the via conductors 104 interposed therebetween.

Further, for example, the high-frequency module 1 according to the present embodiment may include the transmission filter 61T and/or the transmission filter 62T placed on the major surface 91b and connected to the power amplification component 10.

With this, since the transmission filter 61T and/or the transmission filter 62T, which are relatively low-profile components, are placed on the major surface 91b, an increase in the length of the heat dissipation path for the amplification transistor 110 due to an increase in the height on the major surface 91b side of the high-frequency module 1 can be prevented.

Further, for example, the high-frequency module 1 according to the present embodiment may include the shield electrode layer 942 for covering at least a part of the surface of the resin member 92b. At least a part of the transmission filter 61T and/or the transmission filter 62T may overlap at least a part of the shield electrode layer 942 in plan view.

With this, since the side(s), which is/are on the opposite side of the module substrate 91, of the transmission filter 61T and/or the transmission filter 62T placed on the major surface 91b can be covered by the shield electrode layer 942, the entry of external noise to the transmission filter 61T and/or the transmission filter 62T can be prevented, and the heat dissipation of the transmission filter 61T and/or the transmission filter 62T can also be improved.

Further, for example, in the high-frequency module 1 according to the present embodiment, the shield electrode layer 941 may be placed away from the shield electrode layer 942.

With this, the propagation of the heat of the power amplification component 10 to the transmission filter 61T and/or the transmission filter 62T can be prevented so that the degradation of the characteristics of the transmission filter 61T and/or the transmission filter 62T due to the heat can be prevented.

Further, for example, the high-frequency module 1 according to the present embodiment may include the low-noise amplifier 21 placed on the major surface 91a.

With this, circuit components can be placed on both the surfaces of the module substrate 91 so that the high-frequency module 1 can be reduced in size. Further, the low-noise amplifier 21 can be placed on the major surface on the opposite side of the power amplification component 10 so that the isolation between the low-noise amplifier 21 and the power amplification component 10 can be improved. Thus, the electrical characteristics (for example, noise figure (NF)) of the high-frequency module 1 can be improved.

Further, for example, the high-frequency module 1 according to the present embodiment may include the impedance matching circuit 43 placed on the major surface 91a and connected to the power amplification component 10.

With this, the impedance matching circuit 43 that may include an inductor or the like, which tends to be a relatively high-profile component, is placed on the major surface 91a on the opposite side of the power amplification component 10. Thus, an increase in the length of the heat dissipation path for the amplification transistor 110 due to an increase in the height on the major surface 91b side of the high-frequency module 1 can be prevented.

Further, for example, the high-frequency module 1 according to the present embodiment may include: the resin member 92a for covering at least a part of the major surface 91a; and the shield electrode layer 93 for covering at least a part of the resin member 92a. The shield electrode layer 941 may be prevented from being in contact with the shield electrode layer 93.

With this, the propagation of the heat of the power amplification component 10 to the components on the major surface 91a side of the module substrate 91 can be prevented so that the degradation of the characteristics of the components on the major surface 91a side due to the heat can be prevented.

The communication device 5 according to the present embodiment includes the RFIC 3 configured to process a high-frequency signal, and the high-frequency module 1 configured to transfer a high-frequency signal between the RFIC 3 and the antenna 2.

With this, in the communication device 5, the effects similar to those of the high-frequency module 1 described above can be achieved.

Modification 1 of Embodiment 1

Next, Modification 1 of Embodiment 1 is described. The present modification is different from Embodiment 1 described above mainly in the connection configuration between the metal electrode 103 formed on the major surface 101b of the base material 101 of the power amplification component 10 and the major surface 91b of the module substrate 91. Now, the present modification is described with reference to FIG. 7 in terms mainly of the different points from Embodiment 1 described above.

Figure 7:
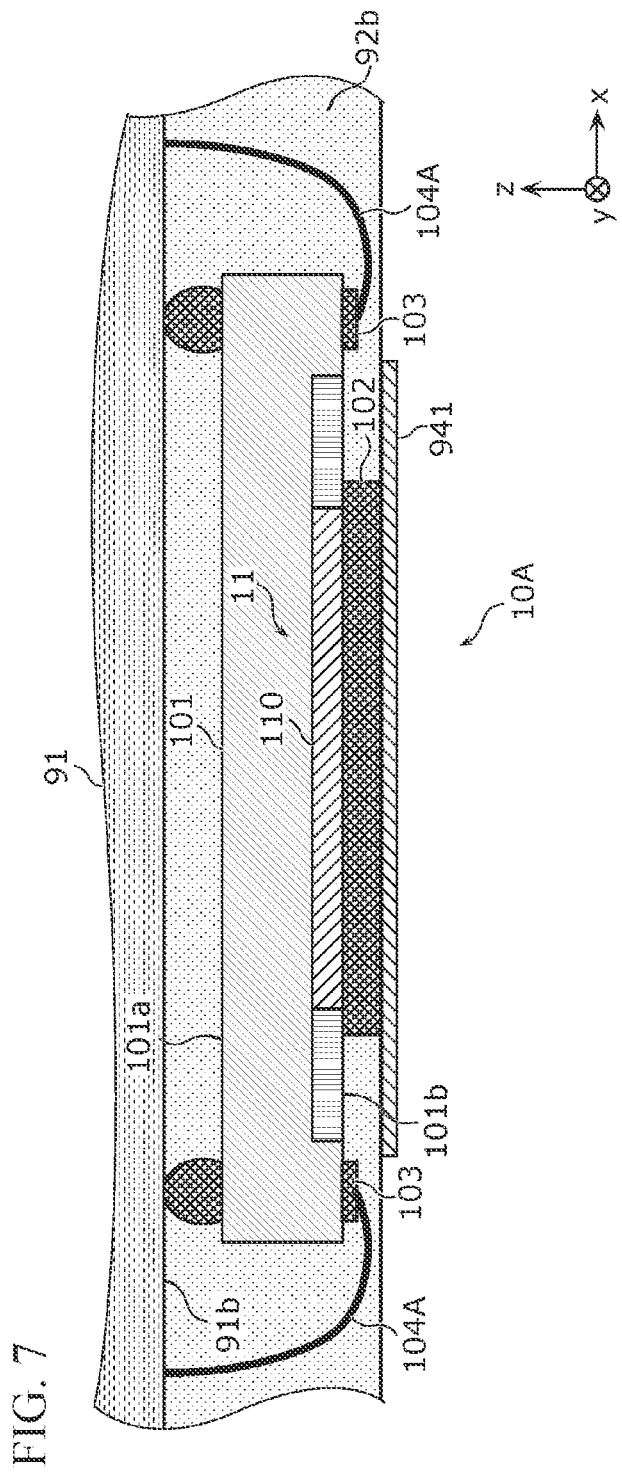
FIG. 7 is an enlarged sectional view of the vicinity of a power amplification component in a high-frequency module according to Modification 1 of Embodiment 1.

FIG. 7 is an enlarged sectional view of the vicinity of a power amplification component 10A in the high-frequency module 1 according to the present modification. As illustrated in FIG. 7, in the high-frequency module 1 according to the present modification, the power amplification component 10A includes a plurality of bonding wires 104A instead of the plurality of via conductors 104.

The plurality of bonding wires 104A connect the plurality of respective metal electrodes 103 to the major surface 91b of the module substrate 91. That is, each of the plurality of metal electrodes 103 is connected to the major surface 91b of the module substrate 91 with the bonding wire 104A interposed therebetween. Specifically, one end of the bonding wire 104A is electrically connected to the corresponding metal electrode 103, and the other end of the bonding wire 104A is electrically connected to an electrode (not illustrated) on the major surface 91b of the module substrate 91. With this, each of the base and collector of the amplification transistor 110 can be connected to the major surface 91b of the module substrate 91 with the metal electrode 103 and the bonding wire 104A interposed therebetween.

As described above, in the high-frequency module 1 according to the present modification, the power amplification component 10A includes the metal electrode 103 placed on the major surface 101b and connected to the amplification transistor 110, and the high-frequency module 1 includes the bonding wire 104A for connecting the metal electrode 103 to the major surface 91b of the module substrate 91.

With this, the collector terminal 113, the output terminal 115, and the input terminal 117 of the amplification transistor 110, which is formed on the major surface 101b side of the base material 101, can be connected to the major surface 91b of the module substrate 91 with the metal electrodes 103 and the bonding wires 104A interposed therebetween.

Modification 2 of Embodiment 1

Next, Modification 2 of Embodiment 1 is described. The present modification is different from Embodiment 1 described above mainly in the connection configuration between the metal electrode 103 formed on the major surface 101b of the base material 101 of the power amplification component 10 and the major surface 91b of the module substrate 91. Now, the present modification is described with reference to FIG. 8 in terms mainly of the different points from Embodiment 1 described above.

Figure 8:
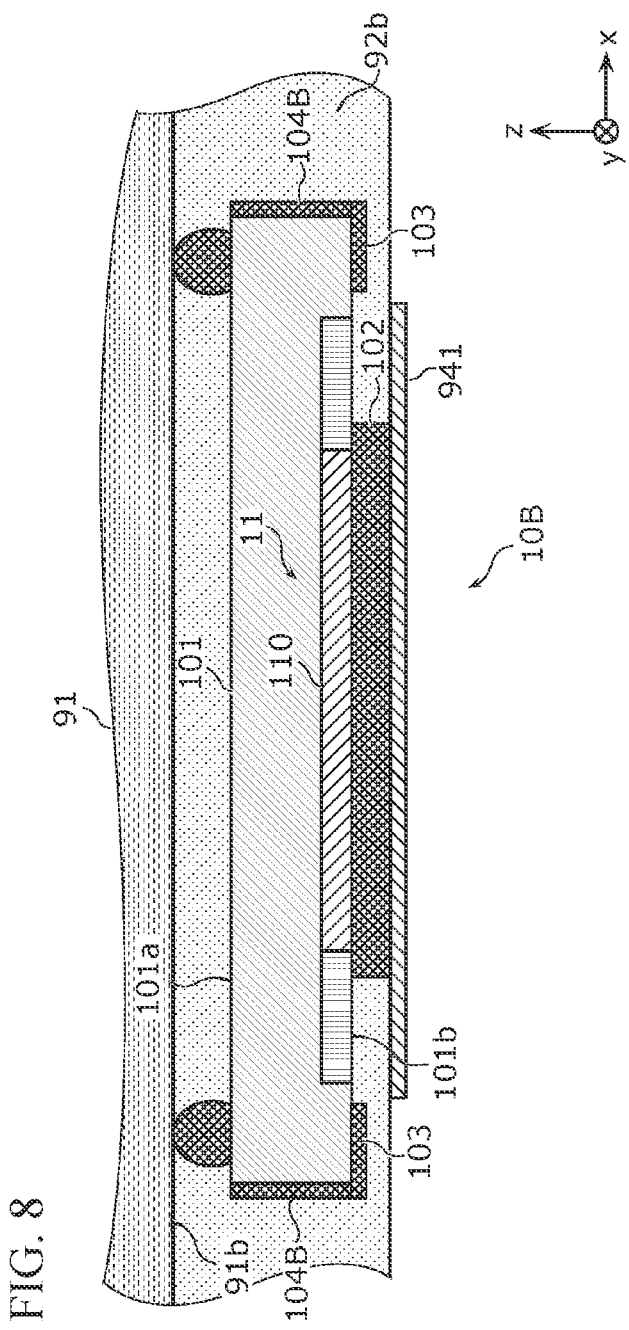
FIG. 8 is an enlarged sectional view of the vicinity of a power amplification component in a high-frequency module according to Modification 2 of Embodiment 1.

FIG. 8 is an enlarged sectional view of the vicinity of a power amplification component 10B in the high-frequency module 1 according to the present modification. As illustrated in FIG. 8, in the high-frequency module 1 according to the present modification, the power amplification component 10B includes a plurality of side wires 104B formed on the side surfaces of the base material 101 instead of the plurality of via conductors 104.

The plurality of side wires 104B connect the plurality of respective metal electrodes 103 to the major surface 91b of the module substrate 91. That is, each of the plurality of metal electrodes 103 is connected to the major surface 91b of the module substrate 91 with the side wire 104B interposed therebetween. Specifically, one end of the side wire 104B is electrically connected to the corresponding metal electrode 103, and the other end of the side wire 104B is electrically connected to an electrode (not illustrated) on the major surface 91b of the module substrate 91. With this, each of the base and collector of the amplification transistor 110 can be connected to the major surface 91b of the module substrate 91 with the metal electrode 103 and the side wire 104B interposed therebetween.

As described above, in the high-frequency module 1 according to the present modification, the power amplification component 10B includes the metal electrode 103 placed on the major surface 101b and connected to the amplification transistor 110, and the high-frequency module 1 includes the side wire 104B formed on the side surface of the base material 101, for connecting the metal electrode 103 to the major surface 91b of the module substrate 91.

With this, the collector terminal 113, the output terminal 115, and the input terminal 117 of the amplification transistor 110, which is formed on the major surface 101b side of the base material 101, can be connected to the major surface 91b of the module substrate 91 with the metal electrodes 103 and the side wires 104B interposed therebetween.

Embodiment 2

Next, Embodiment 2 is described. A high-frequency module 1C according to the present embodiment is mainly different from Embodiment 1 described above in including a single shield electrode layer 94C instead of the two shield electrode layers 941 and 942. Now, the present embodiment is described with reference to FIG. 9 and FIG. 10 in terms mainly of the different points from Embodiment 1 described above.

Figure 9:
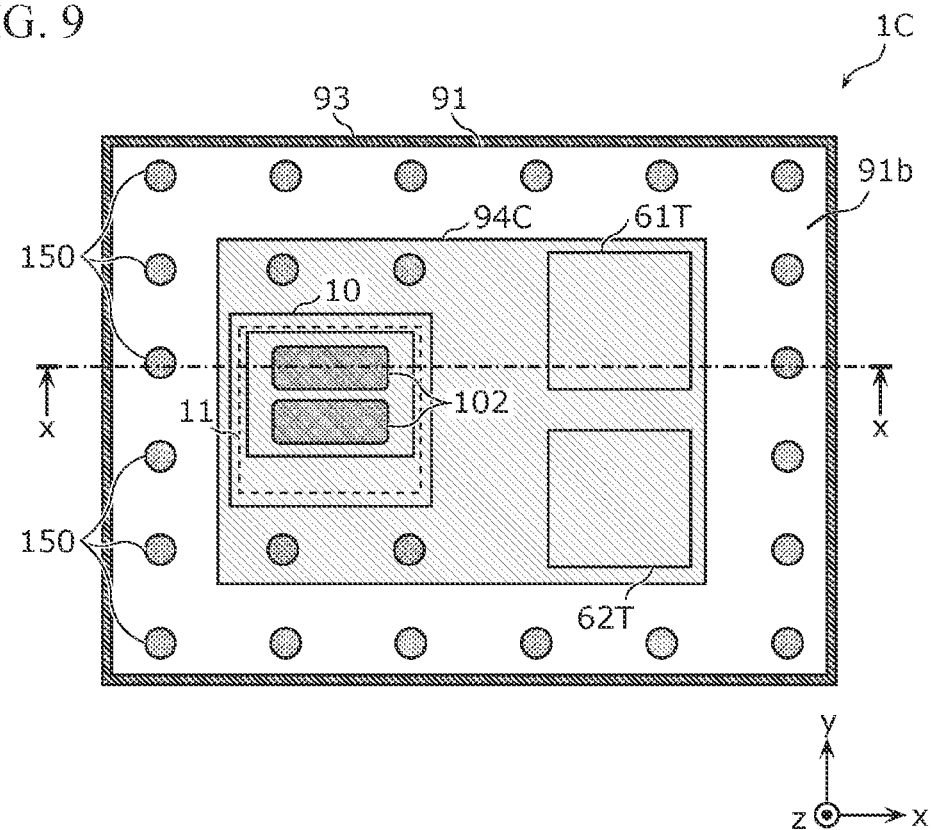
FIG. 9 is a perspective plan view of a high-frequency module according to Embodiment 2.
Figure 10:
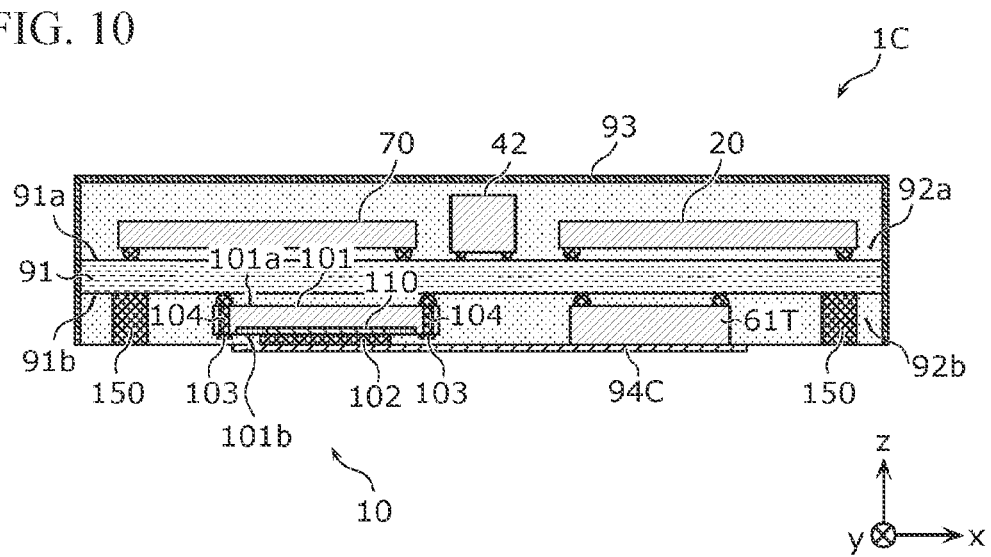
FIG. 10 is a sectional view of the high-frequency module according to Embodiment 2.

FIG. 9 is a perspective plan view of the high-frequency module 1C according to Embodiment 2. Specifically, FIG. 9 is a perspective view of the major surface 91b side of the module substrate 91 when viewed from the positive side of the z axis. FIG. 10 is a sectional view of the high-frequency module 1C according to Embodiment 2. The cross section of the high-frequency module 1C of FIG. 10 corresponds to a cross section taken along the line x-x of FIG. 9.

In the high-frequency module 1C according to the present embodiment, the shield electrode layer 94C is an example of a single integrated shield electrode layer and is represented as the hatched region in FIG. 9. The shield electrode layer 94C corresponds to a layer obtained by integrating the shield electrode layers 941 and 942 of Embodiment 1 and is a metal thin film formed by a sputtering method, for example.

At least a part of the shield electrode layer 94C overlaps at least a part of the metal electrode 102 and at least a part of the transmission filters 61T and 62T in plan view. Specifically, the shield electrode layer 94C is formed to cover the metal electrode 102 and the transmission filters 61T and 62T and is in contact with the metal electrode 102 and the transmission filters 61T and 62T. Meanwhile, the shield electrode layer 94C is not in contact with the shield electrode layer 93. The shield electrode layer 94C is connected to a ground terminal or the like on a motherboard placed in the negative direction of the z axis of the high-frequency module 1C and is thus set to the ground potential.

As described above, in the high-frequency module 1C according to the present embodiment, the shield electrode layer for covering the power amplification component 10 and the transmission filter 61T and/or the transmission filter 62T is the single integrated shield electrode layer 94C.

With this, the heat of the amplification transistor 110 can be further diffused by the shield electrode layer 94C so that the cross-sectional area of the heat dissipation path can be further increased.

OTHER EMBODIMENTS

The high-frequency module and the communication device according to the present disclosure are described above on the basis of the embodiments, but the high-frequency module and the communication device according to the present disclosure are not limited to the embodiments described above. Other embodiments implemented by combining any components of the embodiments described above, modifications obtained by making, to the embodiments described above, various modifications that can be conceived by those skilled in the art without departing from the gist of the present disclosure, and various devices incorporating the high-frequency module and the communication device described above are also included in the present disclosure.

For example, in the circuit configurations of the high-frequency module and the communication device according to each embodiment described above, other components such as circuit elements and wires may be inserted in the paths that connect any of the circuit elements and the signal paths illustrated in the drawings.

Note that, in each embodiment described above, the high-frequency module is a transmitter and receiver module, but is not limited to this. For example, the high-frequency module may be a transmitter module. In this case, the high-frequency module does not necessarily include a low-noise amplifier or the like.

Note that, in each embodiment described above, the high-frequency module may further include transmission paths and/or reception paths for other bands.

Note that, in each embodiment described above, the high-frequency module supports the FDD band, but is not limited to this. For example, the high-frequency module may support the time division duplex (TDD) band, or may support both the FDD band and the TDD band. In this case, it is only necessary for the high-frequency module to include a transmission/reception filter with a pass band that includes the TDD band, and a switch configured to switch between transmission and reception.

The present disclosure can be widely used for communication devices such as cellular phones as a high-frequency module that is placed in a front-end portion.

1, 1C high-frequency module
2 antenna
3 RFIC
4 BBIC
5 communication device
10, 10A, 10B power amplification component
11 power amplifier
20, 70 integrated circuit
21 low-noise amplifier
41, 42, 43, 44 impedance matching circuit
51, 52, 53 switch
61, 62 duplexer
61R, 62R reception filter
61T, 62T transmission filter
71 control circuit
91 module substrate
91a, 91b, 101a, 101b major surface
92a, 92b resin member
93, 94C, 941, 942 shield electrode layer
100 antenna connection terminal
101 base material
102, 103 metal electrode
104 via conductor
104A bonding wire
104B side wire
110 amplification transistor
111 emitter terminal
112 inductor
113 collector terminal
114, 116 capacitor
115 output terminal
117 input terminal
118 bias circuit
121 high-frequency input terminal
122 high-frequency output terminal
130 control terminal
150 post electrode
511, 512, 513, 521, 522, 523, 531, 532, 533 terminal

The invention claimed is:

1. A high-frequency module comprising:
a module substrate having a first major surface and a second major surface, the first major surface and the second major surface facing each other;
a plurality of external connection terminals placed on the second major surface; and
a power amplification component placed on the second major surface, wherein
the power amplification component includes
a base material having a third major surface and a fourth major surface, the third major surface and the fourth major surface facing each other, the third major surface being located between the second major surface and the fourth major surface,
an amplification transistor formed on a side of the fourth major surface of the base material, and
a first metal electrode placed on the fourth major surface and connected to the amplification transistor.

2. The high-frequency module according to claim 1, wherein
at least a part of the first metal electrode overlaps at least a part of the amplification transistor in plan view.

3. The high-frequency module according to claim 1, further comprising:
a first resin member for covering at least a part of the second major surface, wherein
the first metal electrode is projected from the fourth major surface to reach a surface of the first resin member.

4. The high-frequency module according to claim 3, further comprising:
a first shield electrode layer for covering at least a part of the surface of the first resin member, wherein
at least a part of the first metal electrode overlaps at least a part of the first shield electrode layer in plan view, and
an area of the first shield electrode layer is larger than an area of the first metal electrode in the plan view.

5. The high-frequency module according to claim 4, wherein
the first metal electrode is in contact with the first shield electrode layer.

6. The high-frequency module according to claim 1, wherein
the first metal electrode is connected to a ground.

7. The high-frequency module according to claim 1, wherein the power amplification component includes a second metal electrode placed on the fourth major surface and connected to the amplification transistor, and the high-frequency module includes a conductor for connecting the second metal electrode to the second major surface of the module substrate.

8. The high-frequency module according to claim 7, wherein the conductor is a via conductor formed in the base material.

9. The high-frequency module according to claim 7, wherein the conductor is a bonding wire.

10. The high-frequency module according to claim 7, wherein the conductor is a side wire formed on a side surface of the base material.

11. The high-frequency module according to claim 4, further comprising:

a filter placed on the second major surface and connected to the power amplification component.

12. The high-frequency module according to claim 11, further comprising:

a second shield electrode layer for covering at least a part of the surface of the first resin member, wherein at least a part of the filter overlaps at least a part of the second shield electrode layer in plan view.

13. The high-frequency module according to claim 12, wherein the first shield electrode layer is placed away from the second shield electrode layer.

14. The high-frequency module according to claim 12, wherein the first shield electrode layer and the second shield electrode layer are each a single integrated shield electrode layer.

15. The high-frequency module according to claim 1, further comprising:

a low-noise amplifier placed on the first major surface.

16. The high-frequency module according to claim 1, further comprising:

an impedance matching circuit placed on the first major surface and connected to the power amplification component.

17. The high-frequency module according to claim 4, further comprising:

a second resin member for covering at least a part of the first major surface; and a third shield electrode layer for covering at least a part of the second resin member, wherein the first shield electrode layer is not in contact with the third shield electrode layer.

18. A communication device comprising:

a signal processing circuit configured to process a high-frequency signal; and the high-frequency module of claim 1 configured to transfer the high-frequency signal between the signal processing circuit and an antenna.

19. The high-frequency module according to claim 2, further comprising:

a first resin member for covering at least a part of the second major surface, wherein the first metal electrode is projected from the fourth major surface to reach a surface of the first resin member.

20. The high-frequency module according to claim 2, wherein the first metal electrode is connected to a ground.

* * * * *